(12) United States Patent
Chen

(10) Patent No.: US 8,610,169 B2
(45) Date of Patent: Dec. 17, 2013

(54) ELECTROSTATIC DISCHARGE PROTECTION CIRCUIT

(75) Inventor: Wei-Fan Chen, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/476,908

(22) Filed: May 21, 2012

(65) Prior Publication Data
US 2013/0307017 A1  Nov. 21, 2013

(51) Int. Cl.
*H01L 29/66* (2006.01)
(52) U.S. Cl.
USPC ..... 257/173; 257/355; 257/360; 257/E27.015
(58) Field of Classification Search
USPC ........... 257/355, 360, E27.016, 173, E23.153
See application file for complete search history.

(56) References Cited

U.S. PATENT DOCUMENTS

| | | | | |
|---|---|---|---|---|
| 2006/0125054 A1* | 6/2006 | Kim et al. | ...................... | 257/607 |
| 2008/0128817 A1* | 6/2008 | Kim et al. | ...................... | 257/360 |
| 2008/0217650 A1* | 9/2008 | Morishita | ...................... | 257/173 |
| 2009/0057715 A1* | 3/2009 | Ryu et al. | ...................... | 257/173 |
| 2010/0155775 A1* | 6/2010 | Gauthier et al. | ............... | 257/173 |

* cited by examiner

*Primary Examiner* — Bilkis Jahan

(57) ABSTRACT

The invention discloses an ESD protection circuit, comprising a P-type substrate; an N-well formed on the P-type substrate; a P-doped region formed on the N-well, wherein the P-doped region is electrically connected to an input/output terminal of a circuit under protection; a first N-doped region formed on the P-type substrate, the first N-doped region is electrically connected to a first node, and the P-doped region, the N-well, the P-type substrate, and the first N-doped region constitute a silicon controlled rectifier; and a second N-doped region formed on the N-well and electrically connected to a second node, wherein a part of the P-doped region and the second N-doped region constitute a discharging path, and when an ESD event occurs at the input/output terminal, the silicon controlled rectifier and the discharging path bypass electrostatic charges to the first and second nodes respectively.

2 Claims, 12 Drawing Sheets

ELECTROSTATIC DISCHARGE PROTECTION CIRCUIT

BACKGROUND OF THE INVENTION

1. Field of the Invention

The present invention relates to electrostatic discharge protection devices, and in particular relates to electrostatic discharge protection devices with multiple discharging paths.

2. Description of the Related Art

An electrostatic discharge (ESD) event happens when electrostatic charges move from one surface to another. In VLSI circuits, electrostatic current may cause damage to semiconductor junction, metal part, and gate structure. One of the most widely used ESD protection devices is silicon controlled rectifier (SCR). FIG. 1 shows a silicon controlled rectifier 10, comprising a first BJT $Q_{PNP}$ and a second BJT $Q_{NPN}$. The emitter of the first BJT $Q_{PNP}$ is electrically connected to an input/output terminal I/O of a circuit under protection. The base of the first BJT $Q_{PNP}$ is connected to the collector of the second BJT $Q_{NPN}$. The base of the second BJT $Q_{NPN}$ is connected to the collector of the first BJT $Q_{PNP}$. The emitter of the second BJT $Q_{NPN}$ is electrically connected to a reference voltage node GND. When an electrostatic discharge (ESD) event occurs at the input/output terminal I/O, a high voltage potential sets the first BJT $Q_{PNP}$ to a forward biased state, and subsequently sets the second BJT $Q_{NPN}$ to a forward biased state, creating a current path to dissipate electrostatic charges from the input/output terminal I/O to the reference voltage node GND.

However, ESD efficiency of SCR devices may be adversely affected by smaller electrostatic current flow paths. A novel ESD protection device with larger current capacity is desired.

BRIEF SUMMARY OF THE INVENTION

A detailed description is given in the following embodiments with reference to the accompanying drawings. The disclosure includes an electrostatic discharge (ESD) protection circuit, comprising a P-type substrate; an N-well formed on the P-type substrate; at least one P-doped region formed on the N-well, wherein the at least one P-doped region is electrically connected to an input/output terminal of a circuit under protection; a first N-doped region formed on the P-type substrate, wherein the first N-doped region is electrically connected to a first node, and the at least one P-doped region, the N-well, the P-type substrate, and the first N-doped region constitute a silicon controlled rectifier; and a second N-doped region formed on the N-well and electrically connected to a second node, wherein a part of the at least one P-doped region and the second N-doped region constitute a discharging path, and when an ESD event occurs at the input/output terminal, the silicon controlled rectifier and the discharging path bypass electrostatic charges to the first node and the second node, respectively.

The disclosure further teaches an electrostatic discharge protection circuit, comprising a P-type substrate; an N-well formed on the P-type substrate; a first P-doped region formed on the N-well, wherein the first P-doped region is electrically connected to an input/output terminal of a circuit under protection; a first N-doped region formed on the P-type substrate, wherein the first N-doped region is electrically connected to a first node, and the first P-doped region, the N-well, the P-type substrate, and the first N-doped region constitute a silicon controlled rectifier; a second P-doped region formed on the N-well, wherein the second P-doped region is electrically connected to a second node; a second N-doped region formed on the N-well and electrically connected to a second node, wherein the first P-doped region and the second N-doped region constitute a parasitic diode; a gate structure formed on the N-well and located between the first and the second P-doped regions, wherein the gate structure is electrically connected to the second node, and the gate structure and the first and the second P-doped region constitute a MOSFET, wherein when an ESD event occurs at the input/output terminal, the silicon controlled rectifier bypasses electrostatic charges to the first node, and the parasitic diode and the MOSFET bypass electrostatic charges to the second node.

The disclosure further comprises an electrostatic discharge protection circuit, comprising a P-type substrate; an N-well formed on the P-type substrate; a first P-doped region formed on the N-well, wherein the first P-doped region is electrically connected to an input/output terminal of a circuit under protection; a first N-doped region formed on the P-type substrate, wherein the first N-doped region is electrically connected to a first node, and the first P-doped region, the N-well, the P-type substrate, and the first N-doped region constitute a silicon controlled rectifier; a second P-doped region formed on the N-well and electrically connected to a second node; a third P-doped region formed on the N-well and electrically connected to the input/output terminal; a fourth P-doped region formed on the N-well and electrically connected to the second node; a second N-doped region formed on the N-well and electrically connected to the second node, wherein the first P-doped region and the second N-doped region constitute a discharging path; a first gate structure formed on the N-well and located between the first and the second P-doped regions, wherein the first gate structure is electrically connected to the second node; and a second gate structure formed on the N-well and located between the third and the fourth P-doped regions, wherein the second gate structure is electrically connected to the second node, and the first gate structure and the first and the second P-doped regions constitute a first MOSFET, the second gate structure and the third and the fourth P-doped regions constitute a second MOSFET, and the second P-doped region, the N-well, and the third P-doped region constitute a parasitic BJT, wherein when an ESD event occurs at the input/output terminal, the silicon controlled rectifier bypasses electrostatic charges to the first node, and the parasitic diode, the first and the second MOSFETs, and the parasitic BJT bypass electrostatic charges to the second node.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
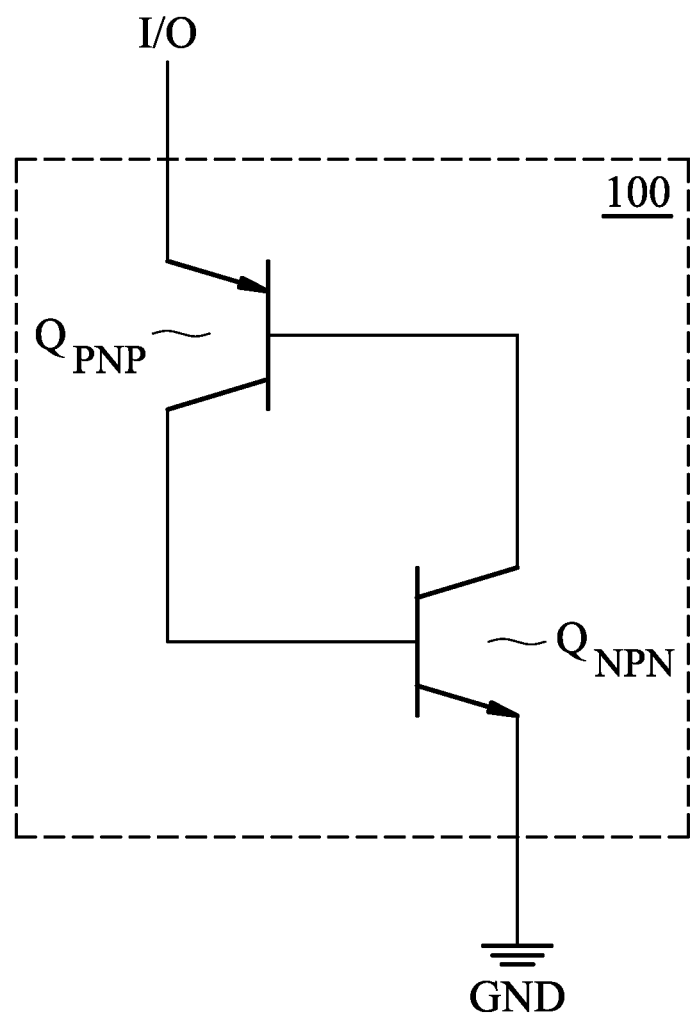
FIG. 1 is a schematic view of a conventional silicon controlled rectifier 100.
Figure 2:
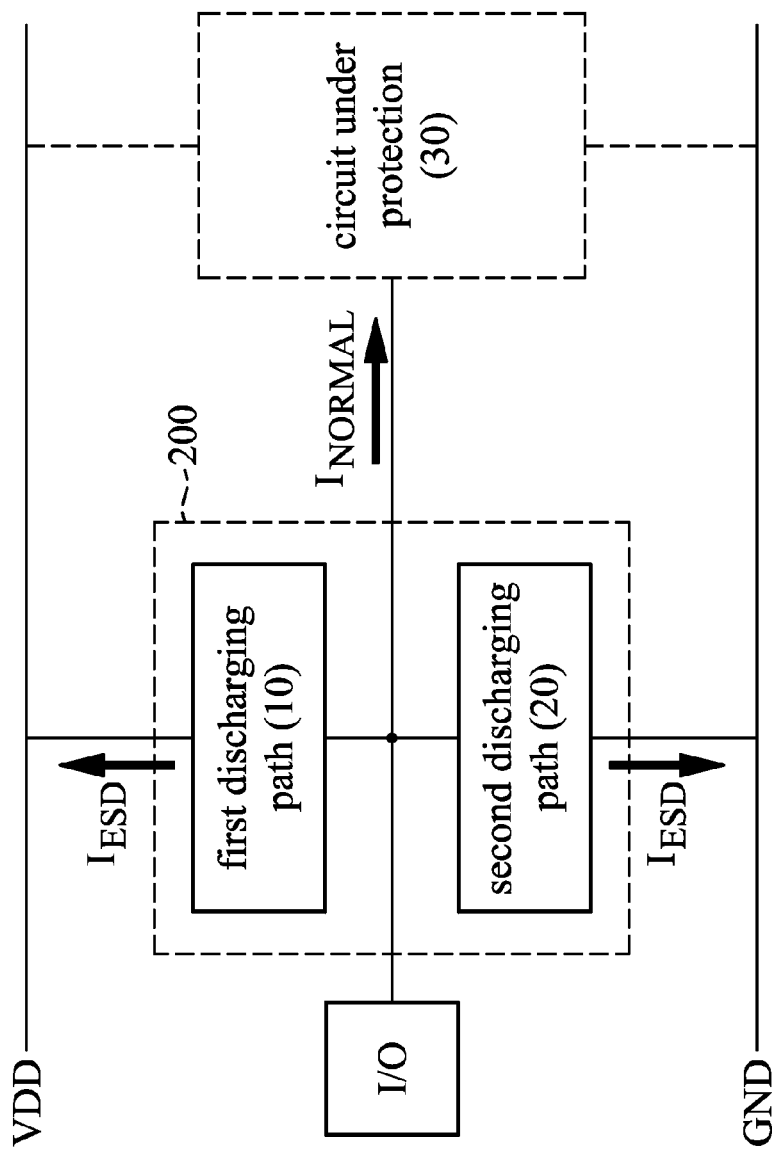
FIG. 2 is a circuit diagram of the ESD protection circuit 200 disclosed in the invention.

FIG. 2 is a circuit diagram of an ESD protection circuit 200 protecting a circuit under protection 30. As shown in FIG. 2, the ESD protection circuit 200 comprises a first discharging path 10 and a second discharging path 20. One end of the first discharging path 10 connects to an input/output terminal I/O of the circuit under protection 30, another end of the first discharging path 10 connects to a first node VDD. In this embodiment, the first node may be but is not limited to a power node. One end of the second discharging path 20 connects to an input/output terminal I/O of the circuit under protection 30, another end of the second discharging path 20 connects to a second node GND. In this embodiment, the second node GND may be but is not limited to a ground reference node. When an ESD event occurs at the input/output terminal I/O, the voltage potential differences between the input/output terminal I/O and the first/second node VDD/GND exceeds the activation voltages of the first and second discharging paths 10 and 20. The first and second discharging paths thus are in ON state and bypass the electrostatic current $I_{ESD}$ away from the circuit under protection 30 to the first/second node VDD/GND, respectively. When under normal operation of the circuit under protection 30, voltage potential differences between the input/output terminal I/O and the first/second node VDD/GND are below the activation voltages of the first and second discharging paths 10 and 20. The discharging paths 10 and 20 are in OFF state, and an operational current $I_{NORMAL}$ will be directly inputted into the circuit under protection 30. In some other embodiments of the invention, the ESD protection circuit may comprises at least a first discharging path and at least a second discharging path.

Figure 3A:
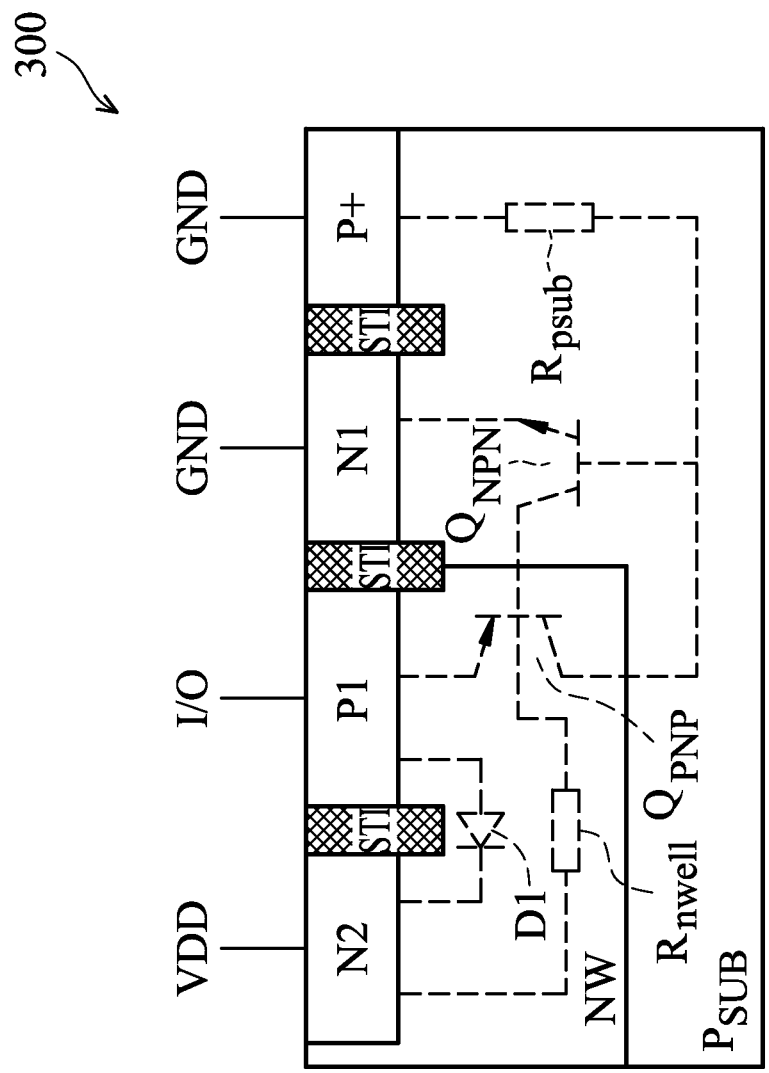
FIG. 3A is a cross sectional view of the ESD protection circuit 300.
Figure 3B:
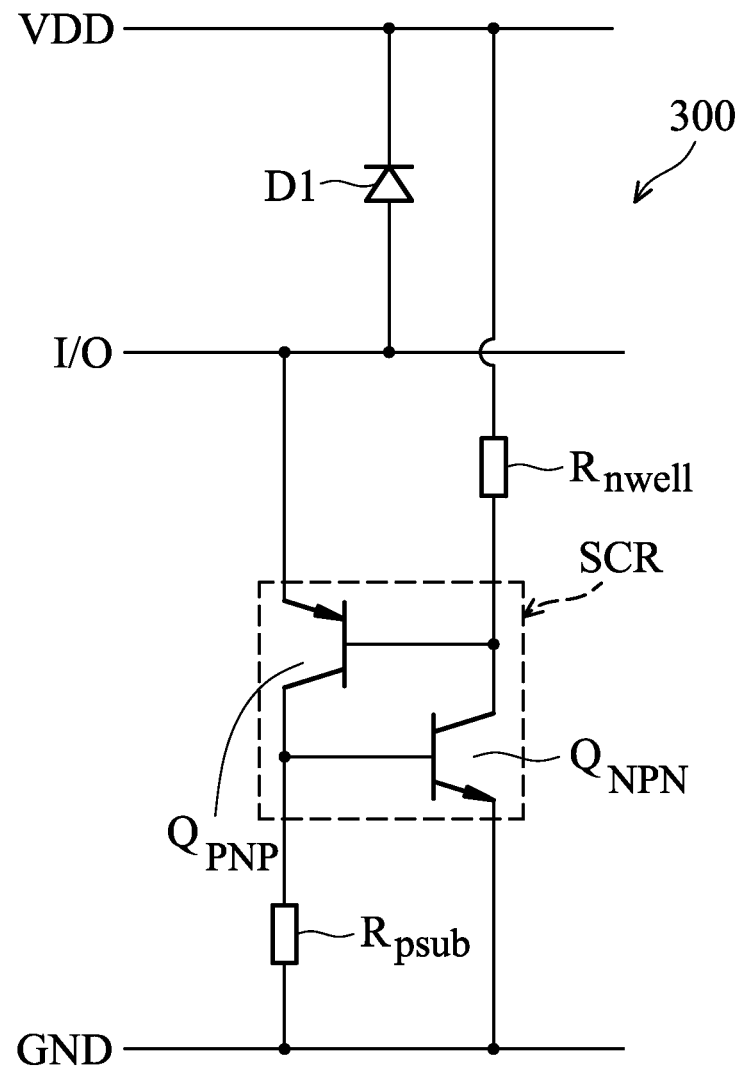
FIG. 3B is an equivalent circuit diagram showing an ESD protection circuit 300.

FIG. 3A is a cross sectional view of an ESD protection circuit 300. FIG. 3B is an equivalent circuit of the ESD protection circuit 300 in FIG. 3A. The ESD protection circuit 300 comprises a P-type substrate $P_{SUB}$ with equivalent impedance of $R_{psub}$, and an N-well NW with equivalent impedance of $R_{nwell}$ is formed on the P-type substrate $P_{SUB}$. In this embodiment, the P-type substrate $P_{SUB}$ may be electrically connected to a ground reference node GND via a P-doped region P+. A first N-doped region N1 is formed on the P-type substrate $P_{SUB}$ and is located adjacent to the N-well NW, and the first N-doped region N1 is electrically connected to the ground reference node GND. A first P-doped region P1 is formed on the N-well NW, and the first P-doped region P1 is electrically connected to an input/output terminal I/O of a circuit under protection. In this embodiment, the first P-doped region P1 and the first N-doped region N1 may be geometrically adjacent to each other. The first P-doped region P1, the N-well NW, and the P-type substrate $P_{SUB}$ serve as the emitter, the base and the collector of a first parasitic BJT $Q_{PNP}$, and the N-well NW, the P-type substrate $P_{SUB}$, and the first N-doped region N1 serve as the emitter, the base and the collector of a second parasitic BJT $Q_{NPN}$.

A second N-doped region N2 is further formed on the N-well NW and is electrically connected to a second node VDD. In this embodiment, the second node VDD is a power node. The second N-doped region N2 is geometrically adjacent to the first P-doped region P1, the first P-doped region P1 and the second N-doped region N2 constitute a parasitic diode D1. Shallow trench isolations STI may be disposed between the first N-doped region N1, the first P-doped region P1, and the second P-doped region P2.

Referring to FIG. 3B, the emitter of the first parasitic BJT $Q_{PNP}$ is connected to the input/output terminal I/O, and the base of the first parasitic BJT $Q_{PNP}$ and the collector of the second parasitic BJT $Q_{NPN}$ are coupled to the power node VDD via the N-well NW with resistance $R_{nwell}$. The collector of the first parasitic BJT $Q_{PNP}$ and the base of the second parasitic BJT $Q_{NPN}$ are coupled to the ground reference node GND via the P-type substrate $P_{SUB}$ with resistance $R_{psub}$. The first/second parasitic BJTs $Q_{PNP}/Q_{NPN}$ construct a silicon controlled rectifier SCR, as shown in FIG. 3B. The anode of the parasitic diode D1 is connected to the input/output terminal I/O, and the cathode of the parasitic diode D1 is connected to the power node VDD.

When an ESD event occurs at the input/output terminal I/O, the voltage difference between the input/output terminal I/O and the second node VDD is larger than the threshold voltage of the parasitic diode D1, and the parasitic diode D1 turns on and bypass electrostatic charges to the second node VDD. In the meantime, the voltage difference between the input/output terminal I/O and the ground reference node GND is larger than the activation voltage of the silicon controlled rectifier SCR, and the first parasitic BJT $Q_{PNP}$ and the second parasitic BJT $Q_{NPN}$ are successively forward biased, bypassing electrostatic charges to the ground reference node GND. With two discharging paths, the ESD protection circuit 300 allows higher discharging current and improves discharge efficiency.

Figure 4A:
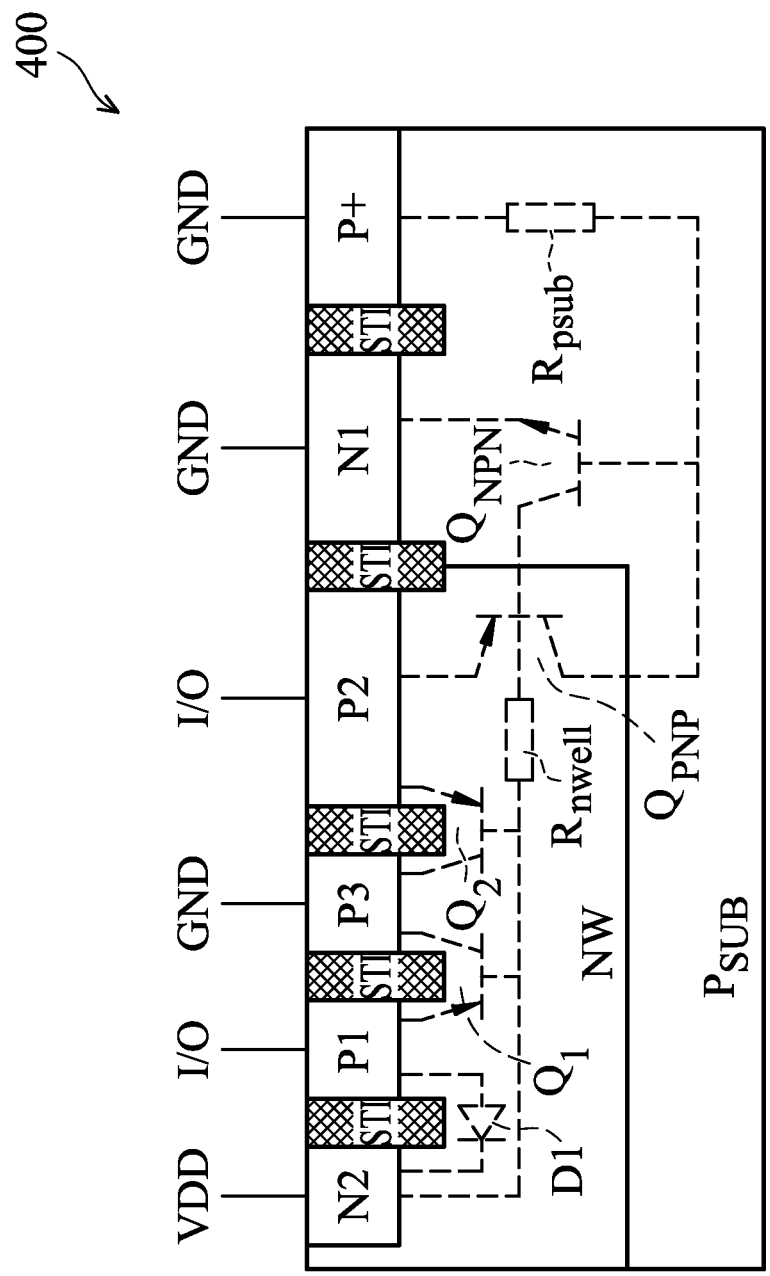
FIG. 4A is a cross sectional view of the ESD protection circuit 400.
Figure 4B:
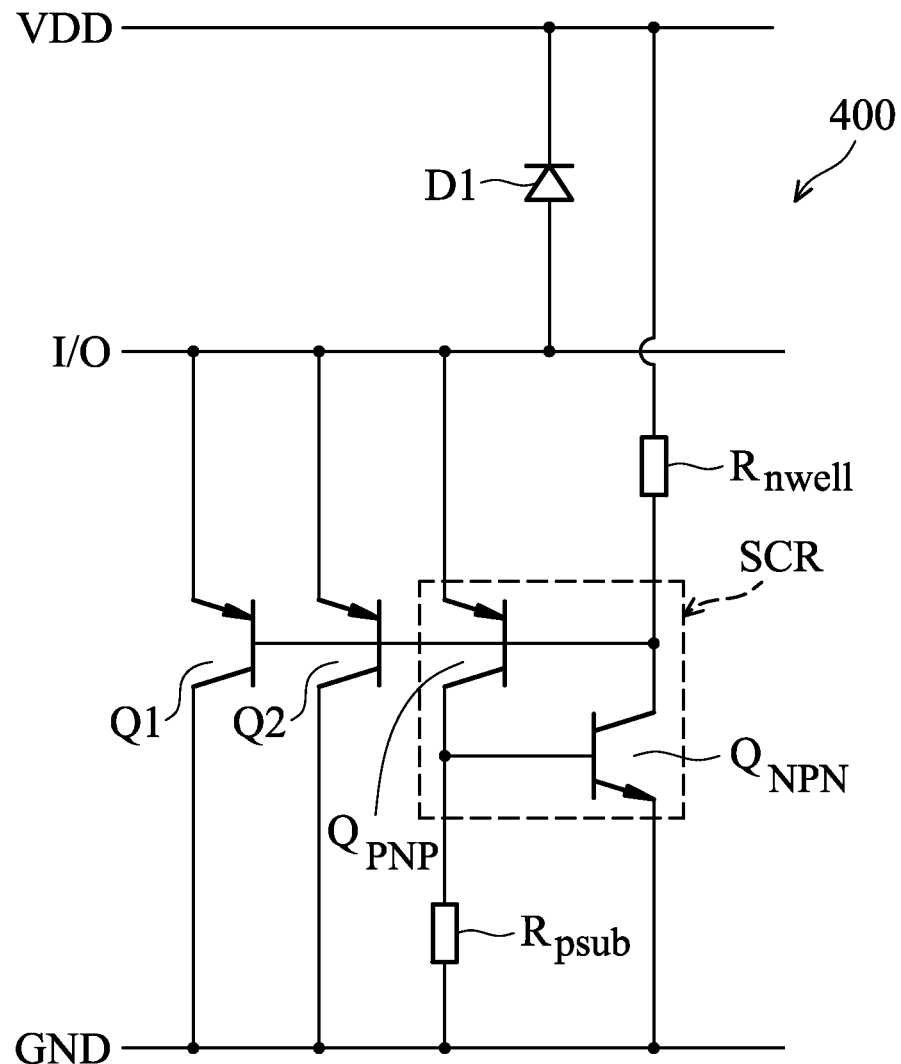
FIG. 4B is an equivalent circuit diagram showing an ESD protection circuit 400.

The embodiment of FIGS. 4A and 4B is another approach of the embodiment of FIGS. 3A and 3B providing an additional discharge path. FIG. 4A is a cross sectional view of an ESD protection circuit 400. FIG. 4B is the equivalent circuit of the ESD protection circuit 400 in FIG. 4A. The difference between the embodiment of FIG. 4A and the embodiment of FIG. 3A is that the embodiment of FIG. 4A further comprises a second P-doped region P2 and a third P-doped region P3 formed on the N-well NW and located between the first P-doped region P1 and the first N-doped region N1, as shown in FIG. 4A. The second P-doped region P2 is adjacent to the first N-doped region N1, and the second P-doped region P2, the N-well NW, and the P-type substrate $P_{SUB}$ constitute a first parasitic BJT $Q_{PNP}$, and the N-well NW, the P-type substrate $P_{SUB}$, and the first N-doped region N1 constitute a second parasitic BJT $Q_{NPN}$. It is to be noticed that the first P-doped region P1 does not constitute the first parasitic BJT $Q_{PNP}$ in this embodiment. The third P-doped region P3 is formed on the N-well and is disposed between the first and the second P-doped region P1/P2, and the third P-doped region P3 is electrically connected to the ground reference node GND. Shallow trench isolations STI may be disposed between the first to third P-doped regions P1 to P3.

The first P-doped region P1, the N-well NW, and the second P-doped region P2 constitute a third parasitic BJT Q1, and the second P-doped region P2, the N-well NW, and the third P-doped region P3 constitute a fourth parasitic BJT Q2.

The third/fourth parasitic BJTs are additional discharging paths from the input/output terminal I/O to the ground reference node GND.

Referring to FIG. 4B, the emitter of the first parasitic BJT $Q_{PNP}$ is connected to the input/output terminal I/O, and the base of the first parasitic BJT $Q_{PNP}$ and the collector of the second parasitic BJT $Q_{NPN}$ are coupled to the power node VDD via the N-well NW with resistance $R_{nwell}$. The collector of the first parasitic BJT $Q_{PNP}$ and the base of the second parasitic BJT $Q_{NPN}$ are coupled to the ground reference node GND via the P-type substrate $P_{SUB}$ with resistance $R_{psub}$. The first/second parasitic BJTs $Q_{PNP}$ and $Q_{NPN}$ constitute a silicon controlled rectifier SCR, as shown in FIG. 4B. The anode of the parasitic diode D1 is connected to the input/output terminal I/O, and the cathode of the parasitic diode D1 is connected to the power node VDD. The emitters of the third/fourth parasitic BJTs Q1 and Q2 are connected to the input/output terminal I/O; the base of third/fourth parasitic BJTs Q1 and Q2 are connected to the power node VDD via the N-well NW with resistance $R_{nwell}$; the collector of third/fourth parasitic BJTs Q1 and Q2 are connected to the ground reference node GND.

When an ESD event occurs at the input/output terminal I/O, the silicon controlled rectifier SCR and the parasitic diode D1 behave the same as those in the embodiment of FIGS. 3A and 3B. The third and the fourth parasitic BJTs Q1/Q2 are forward biased due to the voltage potential difference between the input/output terminal I/O and the ground reference node GND exceeds their threshold voltages. The third and the fourth parasitic BJTs Q1/Q2 further bypass electrostatic charges to the ground reference node GND. The ESD protection circuit 400 allows higher discharging current and improves discharge efficiency.

Figure 5A:
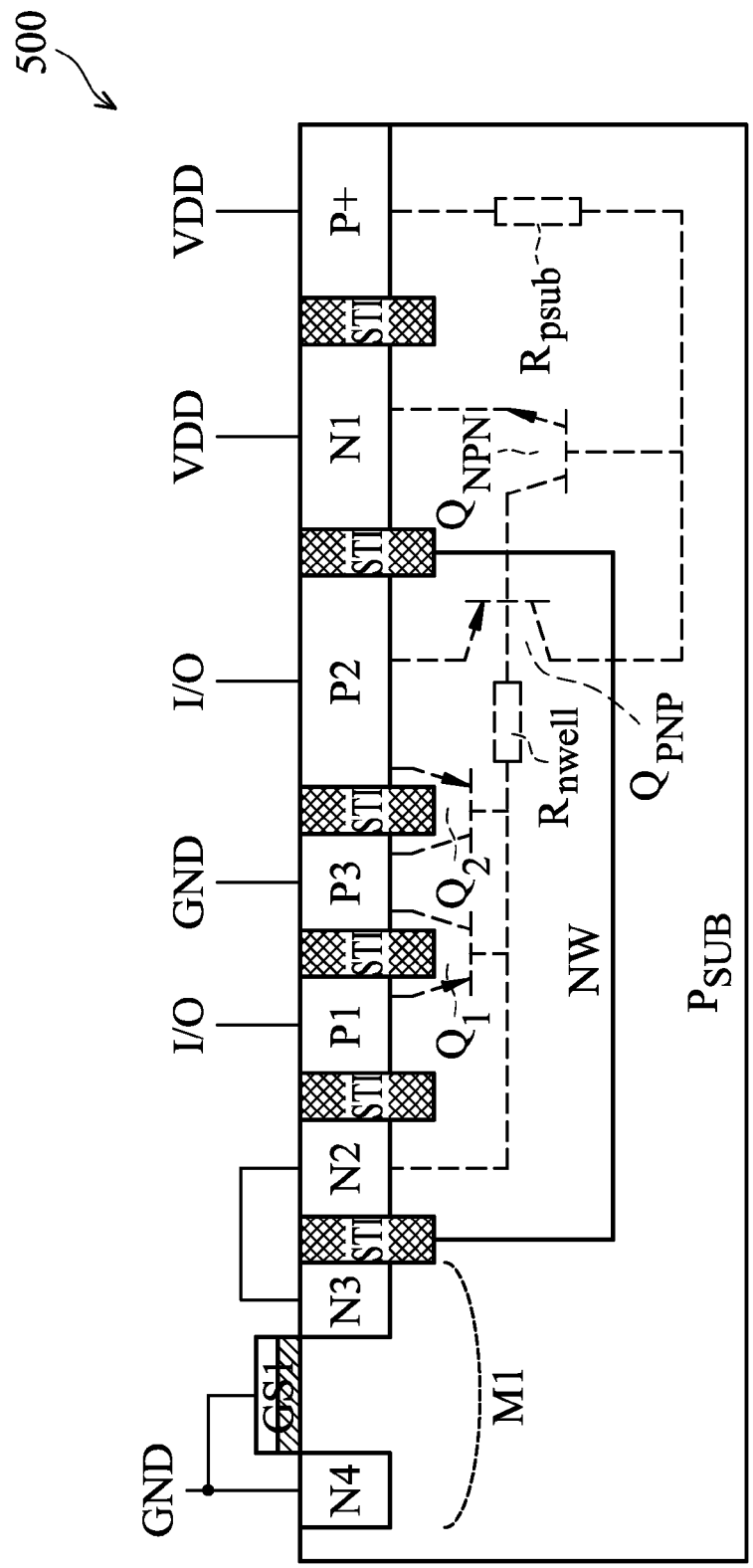
FIG. 5A is a cross sectional view of the ESD protection circuit 500.
Figure 5B:
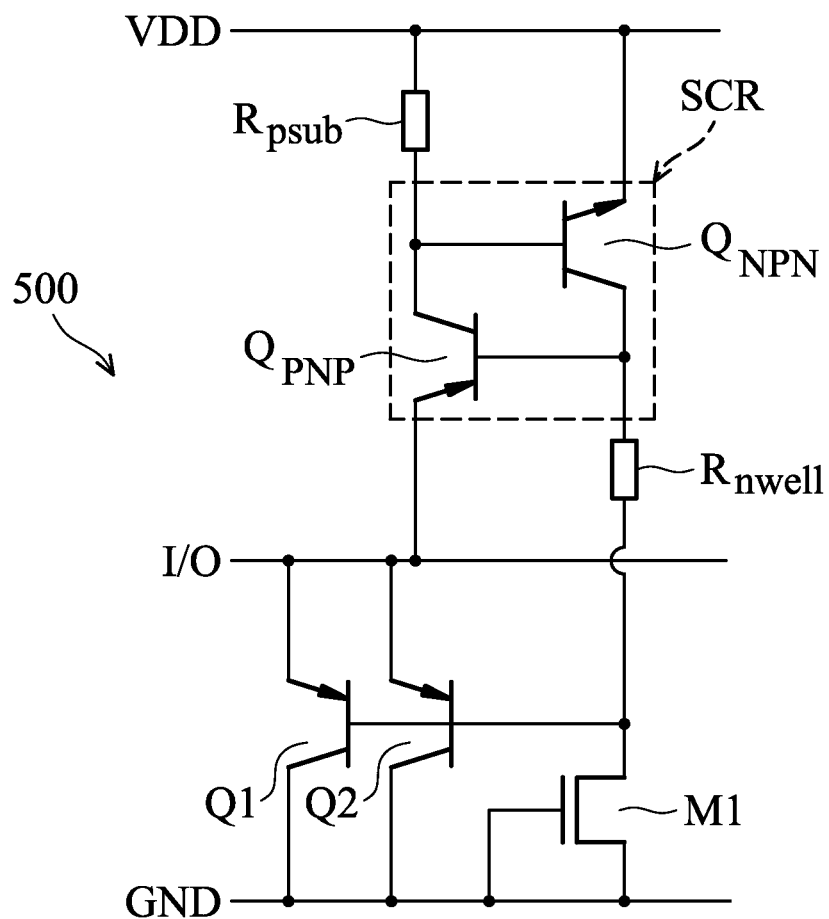
FIG. 5B is an equivalent circuit diagram showing an ESD protection circuit 500.

FIG. 5A is a cross sectional view of another embodiment of an ESD protection circuit 500. FIG. 5B is an equivalent circuit of the ESD protection circuit 500 in FIG. 5A.

The ESD protection circuit 500 comprises a P-type substrate $P_{SUB}$ with equivalent impedance of $R_{psub}$, and an N-well NW with equivalent impedance of $R_{nwell}$ formed on the P-type substrate $P_{SUB}$. In this embodiment, the P-type substrate $P_{SUB}$ may be electrically connected to a power node VDD via a P-doped region P+. A first N-doped region N1 is formed on the P-type substrate $P_{SUB}$ and is located adjacent to the N-well NW, the first N-doped region N1 is electrically connected to the power node VDD. A first P-doped region P1 is formed on the N-well NW, and the first P-doped region P1 is electrically connected to an input/output terminal I/O of a circuit under protection. In this embodiment, the first P-doped region P1 and the first N-doped region N1 may be geometrically adjacent to each other. The first P-doped region P1, the N-well NW, and the P-type substrate $P_{SUB}$ serve as the emitter, the base and the collector of a first parasitic BJT $Q_{PNP}$, and the N-well NW, the P-type substrate $P_{SUB}$, and the first N-doped region N1 serve as the emitter, the base and the collector of a second parasitic BJT $Q_{NPN}$.

A second P-doped region P2 and a third P-doped region P3 are further formed on the N-well NW and located between the first P-doped region P1 and the first N-doped region N1, as shown in FIG. 5A. The second P-doped region P2 is adjacent to the first N-doped region N1, and the second P-doped region P2, the N-well NW, and the P-type substrate $P_{SUB}$ constitute a first parasitic BJT $Q_{PNP}$. The N-well NW, the P-type substrate $P_{SUB}$, and the first N-doped region N1 constitute a second parasitic BJT $Q_{NPN}$. It is to be noted that the first P-doped region P1 does not constitute the first parasitic BJT $Q_{PNP}$ in this embodiment. The third P-doped region P3 is formed on the N-well NW and is disposed between the first and the second P-doped region P1/P2, and the third P-doped region P3 is electrically connected to the ground reference node GND. Shallow trench isolations STI may be disposed between the first to third P-doped regions P1 to P3. A second N-doped region N2 is formed on the N-well NW.

In this embodiment, a third N-doped region N3, a fourth N-doped region N4, and a gate structure GS1 are further formed on the P-type substrate $P_{SUB}$, as shown in FIG. 5A. The third N-doped region N3 is electrically connected to the second N-doped region N2. The fourth N-doped region N4 and the gate structure GS1 are electrically connected to the ground reference node GND, and the third N-doped region N3, the fourth N-doped region N4, and the gate structure GS1 constitute a first MOSFET M1.

Referring to FIG. 5B, the emitter of the first parasitic BJT $Q_{PNP}$ is connected to the input/output terminal I/O, and the base of the first parasitic BJT $Q_{PNP}$ and the collector of the second parasitic BJT $Q_{NPN}$ are coupled to one of the source/drain of the first MOSFET M1 via the N-well NW with resistance $R_{nwell}$. The collector of the first parasitic BJT $Q_{PNP}$ and the base of the second parasitic BJT $Q_{NPN}$ are coupled to the power node VDD via the P-type substrate $P_{SUB}$ with resistance $R_{psub}$. The gate and the other source/drain of the first MOSFET M1 are connected to the ground reference node GND. The first/second parasitic BJTs $Q_{PNP}$ and $Q_{NPN}$ constitute a silicon controlled rectifier SCR, as shown in FIG. 5B. The emitters of the third/fourth parasitic BJTs Q1 and Q2 are connected to the input/output terminal I/O, and the base of the third/fourth parasitic BJTs Q1 and Q2 are connected to the power node VDD via the N-well NW with resistance $R_{nwell}$. The collector of the third/fourth parasitic BJTs Q1 and Q2 are connected to the ground reference node GND.

When an ESD event occurs at the input/output terminal I/O, the silicon controlled rectifier SCR bypasses electrostatic charges to the power node VDD, and the third and the fourth parasitic BJTs Q1/Q2 bypass electrostatic charges to the ground reference node GND. The first MOSFET M1 is also triggered to an ON state due to the voltage potential on the base of the first parasitic BJT $Q_{PNP}$ exceeding the threshold voltage of the first MOSFET M1, and the first MOSFET M1 bypasses electrostatic charges to the ground reference node GND. The ESD protection circuit 500 allows higher discharging current and improves discharge efficiency.

In another embodiment, the first MOSFET M1 shown in FIGS. 5A and 5B may be independently incorporated to the ESD protection circuit 300 of FIGS. 3A and 3B (not shown) as a discharge path to the power node VDD. The gate and one of the source/drain of the first MOSFET M1 is connected to the power node VDD, and the other source/drain of the first MOSFET M1 is coupled to the collector of the second parasitic BJT $Q_{NPN}$ (note that the collector of the second parasitic BJT $Q_{NPN}$ in this embodiment is not directly coupled to the power node VDD).

Figure 6A:
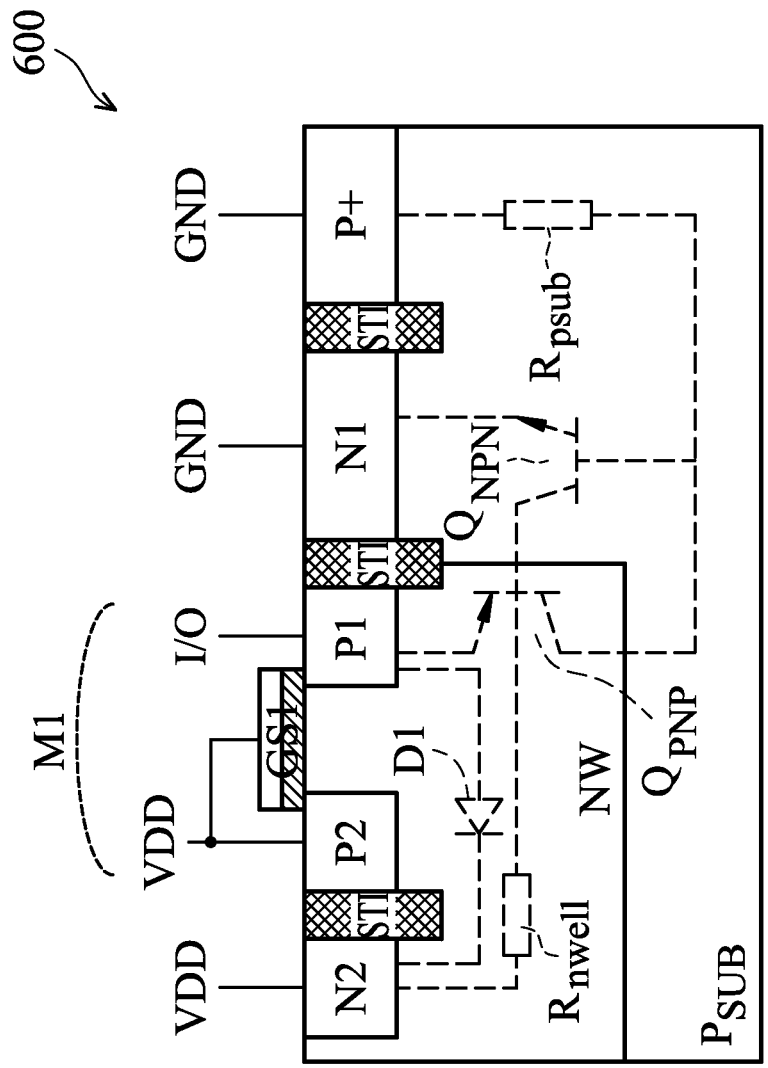
FIG. 6A is a cross sectional view of the ESD protection circuit 600.
Figure 6B:
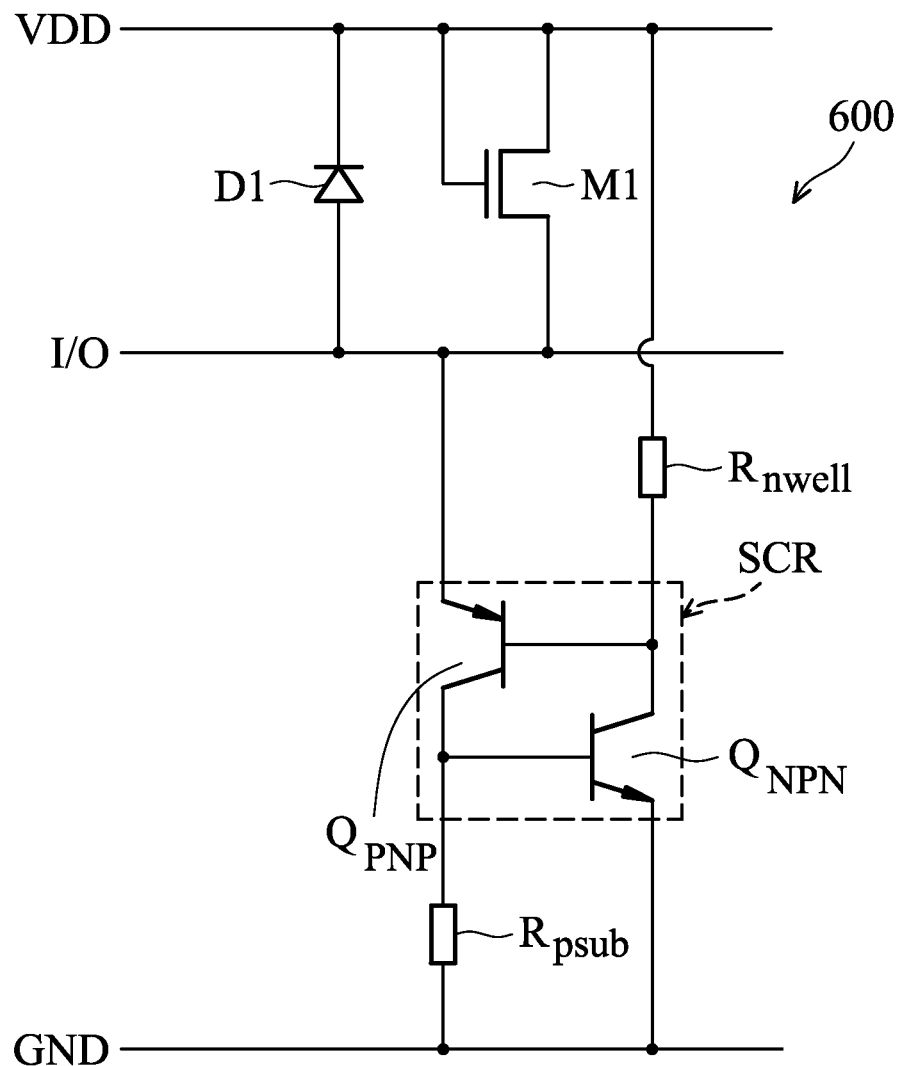
FIG. 6B is an equivalent circuit diagram showing an ESD protection circuit 600.

Another embodiment of an ESD protection circuit 600 providing additional discharge paths is shown in FIGS. 6A and 6B. FIG. 6A is a cross sectional view of another embodiment of the ESD protection circuit 600. FIG. 6B is an equivalent circuit of the ESD protection circuit 600 in FIG. 6A. The ESD protection circuit 600 comprises a P-type substrate $P_{SUB}$, and an N-well NW formed on the P-type substrate $P_{SUB}$. In this embodiment, the P-type substrate $P_{SUB}$ may be electrically connected to a ground reference node GND via a P-doped region P+. A first N-doped region N1 is formed on the P-type substrate $P_{SUB}$, the first N-doped region N1 is electrically connected to the ground reference node GND.

A first P-doped region P1, a second doped region P2, and a gate structure GS1 are formed on the N-well NW. The gate structure GS1 is located between the first P-doped region P1 and the second doped region P2. The first P-doped region P1, the second doped region P2, and the gate structure GS1 constitute a first MOSFET M1, wherein the first P-doped region P1 is electrically connected to an input/output terminal I/O of a circuit under protection, the second P-doped region P2 and the gate structure GS1 are electrically connected to the power node VDD. In this embodiment, the first P-doped region P1 and the first N-doped region N1 may be geometrically adjacent to each other. The first P-doped region P1, the N-well NW, and the P-type substrate $P_{SUB}$, constitute a first parasitic BJT $Q_{PNP}$. The N-well NW, the P-type substrate $P_{SUB}$, and the first N-doped region N1 constitute a second parasitic BJT $Q_{NPN}$. The first/second parasitic BJTs $Q_{PNP}$/$Q_{NPN}$ construct a silicon controlled rectifier SCR, as shown in FIGS. 6A and 6B.

A second N-doped region N2 is further formed on the N-well NW and is electrically connected to the power node VDD. The second N-doped region N2 is geometrically adjacent to the first P-doped region P1, and the first P-doped region P1 and the second N-doped region N2 constitute a parasitic diode D1. Shallow trench isolations STI may be disposed between the first N-doped region N1 and the first P-doped region P1, and between the second P-doped region P2 and the second N-doped region N2.

Referring to FIG. 6B, the emitter of the first parasitic BJT $Q_{PNP}$ is connected to the input/output terminal I/O, and the base of the first parasitic BJT $Q_{PNP}$ and the collector of the second parasitic BJT $Q_{NPN}$ are coupled to the power node VDD via the N-well NW with resistance $R_{nwell}$. The collector of the first parasitic BJT $Q_{PNP}$ and the base of the second parasitic BJT $Q_{NPN}$ are coupled to the ground reference node GND via the P-type substrate $P_{SUB}$ with resistance $R_{psub}$. The first/second parasitic BJTs $Q_{PNP}$ and $Q_{NPN}$ constitute a silicon controlled rectifier SCR, as shown in FIG. 6B. The anode of the parasitic diode D1 is connected to the input/output terminal I/O, and the cathode of the parasitic diode D1 is connected to the power node VDD. The gate and one of the source/drain of the first MOSFET M1 are connected to the power node VDD. The other source/drain of the first MOSFET M1 is connected to the input/output terminal I/O.

When an ESD event occurs at the input/output terminal I/O, the voltage difference between the input/output terminal I/O and the power node VDD is larger than the threshold voltage of the parasitic diode D1 and the first MOSFET M1. Thus the parasitic diode D1 and the first MOSFET M1 bypass electrostatic charges to the power node VDD. In the mean time, the voltage difference between the input/output terminal I/O and the ground reference node GND is larger than the activation voltage of the silicon controlled rectifier SCR. Thus the first parasitic BJT $Q_{PNP}$ and the second parasitic BJT $Q_{NPN}$ are successively forward biased, bypassing electrostatic charges to the ground reference node GND. With multiple discharging paths, the ESD protection circuit 600 allows higher discharging current and improves discharge efficiency.

Figure 7A:
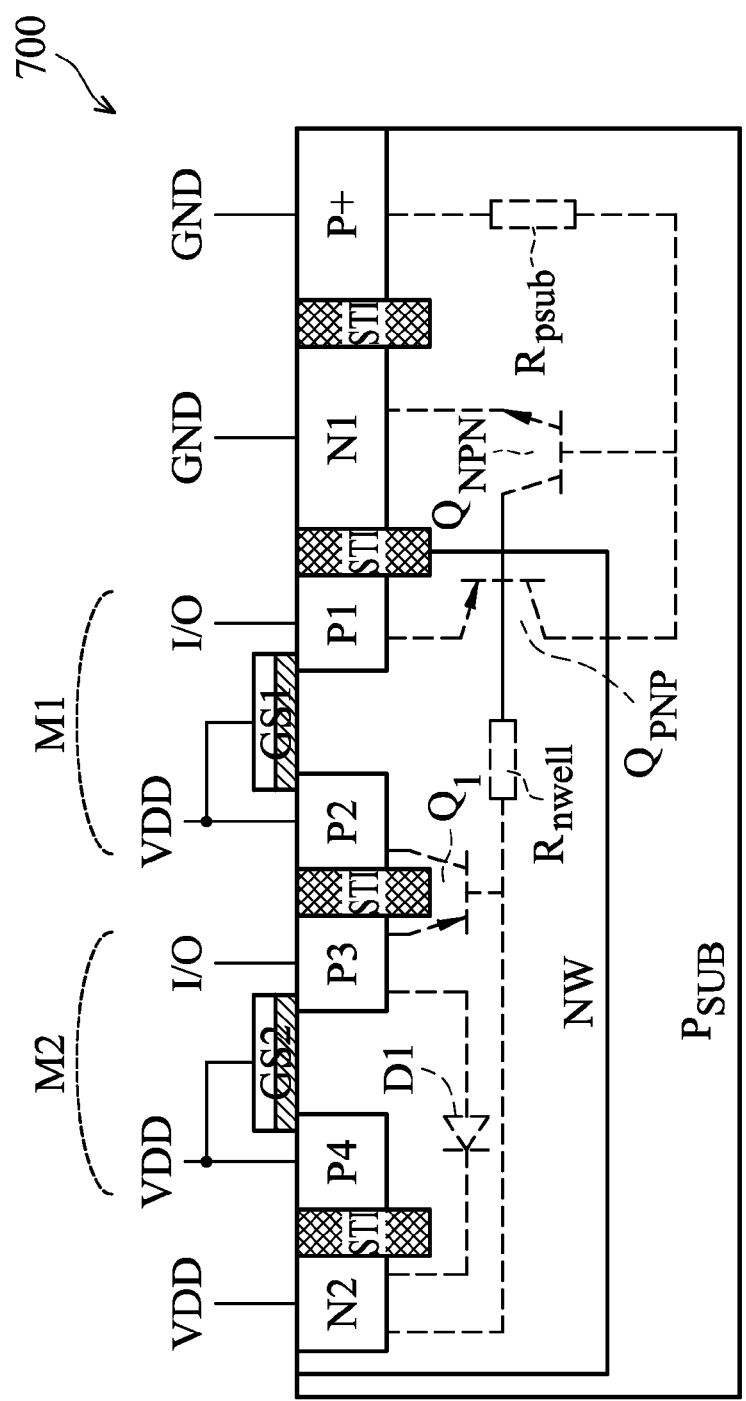
FIG. 7A is a cross sectional view of the ESD protection circuit 700.
Figure 7B:
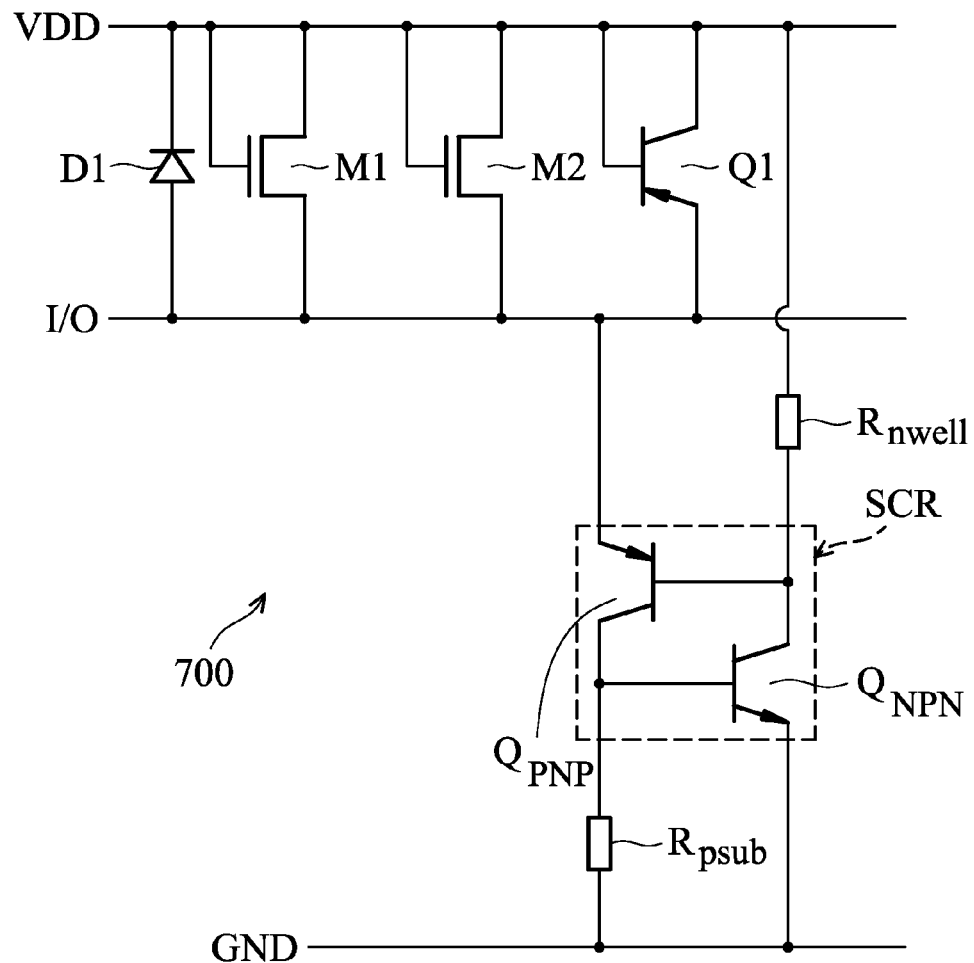
FIG. 7B is an equivalent circuit diagram showing an ESD protection circuit 700.

The embodiment of FIGS. 7A and 7B is another approach of the embodiment of FIGS. 6A and 6B providing additional discharge paths. FIG. 7A is a cross sectional view of another embodiment of an ESD protection circuit 700. FIG. 7B is an equivalent circuit of the ESD protection circuit 700 in FIG. 7A. The difference between the embodiment of FIG. 7A and the embodiment of FIG. 6A is that the embodiment of FIG. 7A further comprises a third P-doped region P3, a fourth doped region P4, and a gate structure GS2 formed on the N-well NW. The gate structure GS2 is located between the third P-doped region P3 and the fourth doped region P4. The third P-doped region P3, the fourth doped region P4, and the gate structure GS2 constitute a second MOSFET M2, wherein the third P-doped region P3 is electrically connected to an input/output terminal I/O of a circuit under protection, and the fourth P-doped region P4 and the gate structure GS2 are electrically connected to the power node VDD. The second P-doped region P2 and the third P-doped region P3 are adjacent to each other, and the second P-doped region P2, the third P-doped region P3, and the N-well constitute an additional parasitic BJT Q1. An additional shallow trench isolation STI may be formed between the second MOSFET M2 and the first MOSFET M1.

Referring to FIG. 7B, the embodiment further comprises a second MOSFET M2 and an additional parasitic BJT Q1 in comparison to the embodiment of FIG. 6B. The gate and one of the source/drain of the first MOSFET M2 are connected to the power node VDD, and the other source/drain of the first MOSFET M2 is connected to the input/output terminal I/O. The collector and the base of the additional parasitic BJT Q1 are connected to the power node VDD. The emitter of the additional parasitic BJT Q1 is connected to the input/output terminal I/O.

When an ESD event occurs at the input/output terminal I/O, the voltage difference between the input/output terminal I/O and the ground reference node GND is larger than the activation voltage of the silicon controlled rectifier SCR, and the first parasitic BJT $Q_{PNP}$ and the second parasitic BJT $Q_{NPN}$ are successively forward biased, bypassing electrostatic charges to the ground reference node GND. In the meantime, the voltage difference between the input/output terminal I/O and the second node VDD is larger than the threshold voltages of the first/second MOSFETs M1/M2, the parasitic diode D1, and the parasitic BJT Q1. The above devices are forward biased and bypass electrostatic charges to the power node VDD. With multiple discharging paths, the ESD protection circuit 700 allows higher discharging current and improves discharge efficiency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection circuit, comprising:
   a P-type substrate;
   an N-well formed on the P-type substrate;
   at least one P-doped region formed in the N-well, wherein the at least one P-doped region is electrically connected to an input/output terminal of a circuit under protection, and further comprises a first P-doped region and a second P-doped region;
   a first N-doped region formed in the P-type substrate, wherein the first N-doped region is electrically connected to a first node, wherein the second P-doped region is adjacent to the first N-doped region, and wherein the second P-doped region, the N-well, the P-type substrate, and the first N-doped region constitute a silicon controlled rectifier;
   a second N-doped region formed in the N-well and electrically connected to a second node, wherein the first P-doped region is adjacent to the second N-doped region, and wherein the first P-doped region and the second N-doped region constitute a discharging path; and a third P-doped region formed in the N-well and disposed between the first and the second P-doped regions, wherein the third P-doped region is electrically connected to the first node;

wherein the first P-doped region, the N-well, and the second P-doped region constitute a first parasitic BJT, and the second P-doped region, the N-well, and the third P-doped region constitute a second parasitic BJT, and wherein when an ESD event occurs at the input/output terminal, the silicon controlled rectifier, the first BJT, and the second BJT bypass electrostatic charges to the first node, and the discharging path bypasses electrostatic charges to the second node.

2. The electrostatic discharge protection circuit in claim 1 further comprising a third N-doped region, a fourth N-doped region, and a gate structure formed on the P-type substrate, wherein:

the third N-doped region is electrically connected to the second node, the fourth N-doped region and the gate structure are electrically connected to a third node; and the third N-doped region, the fourth N-doped region, and the gate structure constitutes a first MOSFET, wherein when the ESD event occurs at the input/output terminal, the first MOSFET bypasses electrostatic charges to the third node.

* * * * *